(12) United States Patent
Zhao (10) Patent No.: US 11,927,782 B2
(45) Date of Patent: Mar. 12, 2024

(54) PHASE RETARDATION DEVICE, PREPARATION METHOD THEREFOR, AND DISPLAY APPARATUS

(71) Applicant: Beijing Rayboch Technology Co., Ltd., Beijing (CN)

(72) Inventor: Wenqing Zhao, Beijing (CN)

(73) Assignee: Beijing Rayboch Technology Co., Ltd., Beijing (CN)

( * ) Notice: Subject to any disclaimer, the term of this patent is extended or adjusted under 35 U.S.C. 154(b) by 0 days.

(21) Appl. No.: 18/200,729

(22) Filed: May 23, 2023

(65) Prior Publication Data
US 2023/0288621 A1    Sep. 14, 2023

Related U.S. Application Data

(63) Continuation of application No. PCT/CN2021/137784, filed on Dec. 14, 2021.

(30) Foreign Application Priority Data

Dec. 16, 2020 (CN) .......................... 202011493604.6

(51) Int. Cl.
*G02B 5/30* (2006.01)
*H10K 59/80* (2023.01)
*G02F 1/13363* (2006.01)

(52) U.S. Cl.
CPC ....... *G02B 5/3016* (2013.01); *H10K 59/8791* (2023.02); *G02F 1/133633* (2021.01); *G02F 1/133636* (2013.01)

(58) Field of Classification Search
CPC .. G02B 5/3016; H10K 59/8791; H10K 59/00; G02F 1/133633; G02F 1/133636
See application file for complete search history.

(56) References Cited

U.S. PATENT DOCUMENTS 9,298,041 B2 *   3/2016   Escuti .................. G02B 5/3083
2013/0107173 A1    5/2013   Takeda et al.

FOREIGN PATENT DOCUMENTS

| CN | 101206328 A | 6/2008 |
|----|-------------|--------|
| CN | 211979379 U | 11/2020 |
| CN | 112230478 A | 1/2021 |

* cited by examiner

*Primary Examiner* — Paisley L Wilson
(74) *Attorney, Agent, or Firm* — NZ CARR LAW OFFICE (57) ABSTRACT

Provided are a phase retardation device, a preparation method therefor, and a display apparatus. The phase retardation device includes: a linear polarization layer, a first alignment layer, a first liquid crystal layer and a second liquid crystal layer; the linear polarization layer is located on one side of a light source; the first alignment layer is located on a side of the linear polarization layer away from the light source; the first liquid crystal layer is located on a side of the first alignment layer away from the light source; the second liquid crystal layer is located on a side of the first liquid crystal layer away from the first alignment layer, the second liquid crystal layer comprises a first subpart adjacent to the first liquid crystal layer, a second subpart and a third subpart.

10 Claims, 4 Drawing Sheets

PHASE RETARDATION DEVICE, PREPARATION METHOD THEREFOR, AND DISPLAY APPARATUS

TECHNICAL FIELD

The disclosure refers to the field of display technology, and in particular to a phase retardation device, a preparation method therefor, and a display apparatus.

BACKGROUND

With the rapid development of Organic Light Emitting Diode (OLED) technology, OLED display panel is used in more and more electronic devices such as mobile phones, tablet computers. Inside the OLED display panel, in order to solve the problem of contrast due to the reflection of natural light by the metal inside the OLED display panel, the OLED display may use a phase retardation device (such as a circular polarizer) to control this reflection.

The circular polarizer may be composed of a linear polaroid and two superimposed wave plates. The two superimposed wave plates may be a half-wave plate and a quarter-wave plate, respectively. Since the circular polarizer needs to have a wide band performance, the fast axis angle of the quarter-wave plate and the linear polaroid is different from the fast axis angle of the half-wave plate and the linear polaroid.

Therefore, when preparing the circular polarizer, it is necessary to conduct one alignment for each of the half-wave plate and the quarter-wave plate respectively based on different alignment angles (i.e., at least 2 alignments are required). Due to the high complexity of the alignment process, multiple alignments lead to low preparation efficiency of the phase retardation device and poor device yield.

SUMMARY

The purpose of some embodiments of the disclosure is to provide a phase retardation device and a preparation method therefor, and a display apparatus, to solve the problems of low preparation efficiency and poor device yield in the preparation of a phase retardation device that exist in the prior art.

In order to solve the above technical problems, the embodiments of the disclosure are implemented as follows.

In a first aspect, embodiments of the present disclosure provide a phase retardation device, the phase retardation device comprises: a linear polarization layer, a first alignment layer, a first liquid crystal layer and a second liquid crystal layer; the linear polarization layer is located on one side of a light source and is configured to convert received light into linear polarized light; the first alignment layer is located on a side of the linear polarization layer away from the light source and is configured to align liquid crystals in the first liquid crystal layer based on a preset alignment angle; the first liquid crystal layer is located on a side of the first alignment layer away from the light source and is configured to convert the linear polarized light into elliptical polarized light; the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light via the helical structure of the second subpart.

Optionally, a phase retardation amount of the first liquid crystal layer is a first preset value, and a phase retardation amount of the second liquid crystal layer is a second preset value determined based on the first preset value and a preset compensation value.

Optionally, the phase retardation device further comprises a second alignment layer, the second alignment layer is located between the first liquid crystal layer and the second liquid crystal layer and is configured to align liquid crystals in the first subpart based on the preset alignment angle when the liquid crystal alignment angle of the first subpart is different from the liquid crystal alignment angle of the first liquid crystal layer.

Optionally, the phase retardation device further comprises a refractive film layer, the refractive film layer is adjacent to the third subpart of the second liquid crystal layer and is configured to adjust a viewing angle corresponding to the circular polarized light.

Optionally, the refractive film layer has a refractive index satisfying $N_Z > N_X = N_Y$, wherein $N_X$ is a refractive index of the refractive film layer in a direction of lagging phase axis, $N_Y$ is a refractive index of the refractive film layer in a direction of overrunning phase axis, and $N_Z$ is a refractive index of the refractive film layer in a thickness direction.

Optionally, the first liquid crystal layer and the second liquid crystal layer each comprises Reactive Mesogen.

In a second aspect, embodiments of the present disclosure provide a display apparatus comprising the phase retardation device described in the first aspect above.

In a third aspect, embodiments of the present disclosure provide a preparation method for a phase retardation device, the method is applicable to a display apparatus described in the second aspect, the method comprises:

aligning liquid crystals in a first liquid crystal layer at a first alignment layer based on a preset alignment angle;

determining, based on a preset correspondence between an alignment angle and a helical angle, a helical angle of a second subpart of the second liquid crystal layer corresponding to the preset alignment angle, so that an elliptical polarized light is converted to a circular polarized light satisfying a preset light conversion requirement under the action of a helical structure of the second subpart.

Optionally, the phase retardation device further comprises a second alignment layer, before determining, based on a preset correspondence between an alignment angle and a helical angle, a helical angle of a second subpart of the second liquid crystal layer corresponding to the preset alignment angle, the method further comprises:

obtaining a liquid crystal alignment angle of a first subpart of the second liquid crystal layer;

aligning liquid crystals in the first subpart of the second liquid crystal layer at the second alignment layer based on the preset alignment angle, when it is detected that the liquid crystal alignment angle is different from the preset alignment angle.

Optionally, before determining, based on a preset correspondence between an alignment angle and a helical angle, a helical angle of a second subpart of the second liquid crystal layer corresponding to the preset alignment angle, the method further comprises:

obtaining a liquid crystal alignment angle of a first subpart of the second liquid crystal layer;

taking a liquid crystal layer whose anchoring energy is greater than preset anchoring energy as the first liquid crystal layer, when it is detected that the liquid crystal alignment angle is different from the preset alignment angle.

In a fourth aspect, embodiments of the present application provide an electronic device comprising a processor and a memory. A computer program is stored on the memory and executable by the processor, and the computer program when executed by the processor implements the steps of the preparation method for the phase retardation device provided in the above embodiments.

In a fifth aspect, embodiments of the present application provide a computer-readable storage medium storing a computer program, and the computer program when executed by a processor implements the steps of the preparation method for the phase retardation device provided in the above embodiments.

It can be seen from the technical solutions provided by the embodiments of the present disclosure that embodiments of the present disclosure provide a phase retardation device and a preparation method therefor, and a display apparatus, the phase retardation device comprises: a linear polarization layer, a first alignment layer, a first liquid crystal layer and a second liquid crystal layer; the linear polarization layer is located on one side of a light source and is configured to convert received light into linear polarized light; the first alignment layer is located on a side of the linear polarization layer away from the light source and is configured to align liquid crystals in the first liquid crystal layer based on a preset alignment angle; the first liquid crystal layer is located on a side of the first alignment layer away from the light source and is configured to convert the linear polarized light into elliptical polarized light; the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

BRIEF DESCRIPTION OF DRAWINGS

In order to illustrate the technical solutions of the embodiments of the disclosure or in the prior art clearly, the following is a brief description of the drawings necessary to describe the embodiments or prior art. It is obvious that the drawings as described in the following are only some of the embodiments of the disclosure, and other drawings can be obtained from these drawings without creative labor for those of ordinary skill in the art.

DETAILED DESCRIPTION OF EMBODIMENTS

The disclosure provides a phase retardation device and a preparation method therefor, and a display apparatus.

In order to enable those skilled in the art to better understand the technical solutions in this disclosure, the technical solutions of embodiments in this disclosure will be clearly and completely described below in conjunction with drawings of the embodiments in this disclosure. Obviously, the embodiments described are only a part of the embodiments of this disclosure, and not all of them. Based on the embodiments in this disclosure, all other embodiments obtained by a person of ordinary skill in the art without creative labor shall fall within the protection scope of this disclosure.

Figure 1:
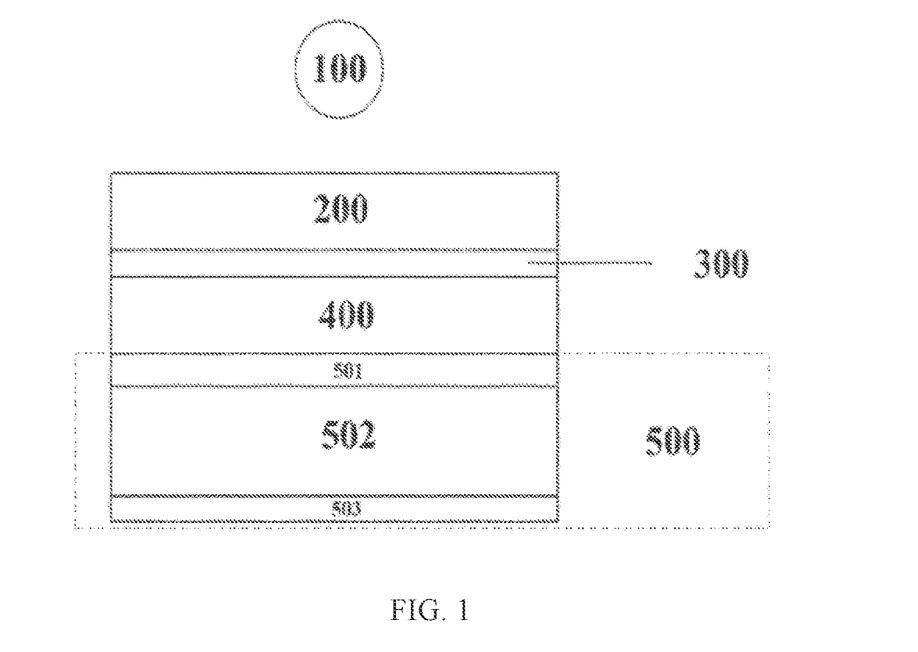
FIG. 1 is a first structural schematic diagram of a phase retardation device according to the embodiments of the disclosure.

FIG. 1 is a first structural schematic diagram of a phase retardation device according to the embodiments of the disclosure. The phase retardation device comprises: a linear polarization layer 200, a first alignment layer 300, a first liquid crystal layer 400, and a second liquid crystal layer 500.

The linear polarization layer 200 is located on one side of a light source 100 and is configured to convert received light into linear polarized light. The light source 100 may be any light source 100 capable of emitting natural light, and the linear polarization layer 200 may include any device capable of converting the natural light emitted by the light source 100 into linear polarized light, such as a linear polaroid, a line grid polarizer, etc.

Figure 2:
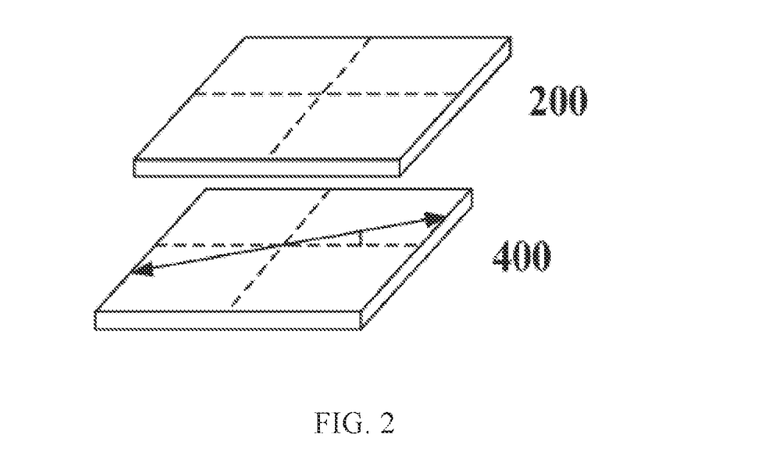
FIG. 2 is a second structural schematic diagram of a phase retardation device according to the embodiments of the disclosure.

The first alignment layer 300 can be located on a side of the linear polarization layer 200 away from the light source 100 and is configured to align liquid crystals in the first liquid crystal layer 400 based on a preset alignment angle. As shown in FIG. 2, the preset alignment angle may be an angle between a liquid crystal alignment direction of the first liquid crystal layer 400 and the fast axis of the linear polarization layer 200. The preset alignment angle may be any alignment angle within a preset angle range, such as the preset angle range may be 5° to 20°, and the preset alignment angle may be 14°, i.e., the first alignment layer 300 may, based on an angle of 14°, align the liquid crystals of the first liquid crystal layer 400, so that the angle between an optical axis of the first liquid crystal layer 400 and the fast axis of the linear polarization layer 200 is 14°.

For the alignment of the first alignment layer 300, an optical alignment method may be used, and in addition to this, there can be frictional alignment and other alignment methods, which may vary according to the actual application scenario. The embodiments of the present application do not make specific limitations on the alignment process of the first alignment layer 300.

The first liquid crystal layer 400 can be located on a side of the first alignment layer 300 away from the light source 100 and is configured to convert the linear polarized light to elliptical polarized light. Since the liquid crystals in the first liquid crystal layer 400 are aligned by the first alignment layer 300 based on the preset alignment angle, the liquid crystals in the first liquid crystal layer 400 will be aligned in a direction corresponding to the preset alignment angle after coating. After the first alignment layer 300 is made, the first liquid crystal layer 400 can be coated, and then the first liquid crystal layer 400 may be cured using UV light curing.

Since there is no rotation of the liquid crystals in the first liquid crystal layer 400, there is only one alignment direction of the liquid crystals in the first liquid crystal layer 400 from the top (i.e., the side adjacent to the first alignment layer 300) to the bottom (i.e., the side adjacent to the second liquid crystal layer 500).

The second liquid crystal layer 500 can be located on a side of the first liquid crystal layer 400 away from the first alignment layer 300, and the second liquid crystal layer 500 may comprise a first subpart 501, a second subpart 502, and a third subpart 503. The first subpart 501 may be the side of the second liquid crystal layer 500 adjacent to the first liquid crystal layer 400, i.e., as shown in FIG. 1, the first subpart 501 may be the top of the second liquid crystal layer 500, the second subpart 502 may be the interior of the second liquid crystal layer 500, and the third subpart 503 may be the bottom of the second liquid crystal layer 500.

Liquid crystal material used in the first liquid crystal layer 400 and the second liquid crystal layer 500 may be a conventional reactive liquid crystal or a reactive liquid crystal with negative distribution, which may vary according to the actual application scenario, and the embodiments of the present application do not specifically limit in this regard.

The first subpart 501 may be adjacent to the first liquid crystal layer 400, and a liquid crystal alignment angle of the first subpart 501 is the same as a liquid crystal alignment angle of the first liquid crystal layer 400. Since when the first liquid crystal layer 400 is aligned by the first alignment layer 300, anchoring energy used to align the first liquid crystal layer 400 may pass through the first liquid crystal layer 400 and reach the first subpart 501 of the second liquid crystal layer 500, the liquid crystal alignment angle of the first subpart 501 may be the same as the liquid crystal alignment angle of the first liquid crystal layer 400 under the action of the anchoring energy, i.e., the liquid crystal alignment angle of the first subpart 501 may be the preset alignment angle.

The second subpart 502 may be a helical structure having a preset helical angle, and the preset helical angle may be a helical angle determined according to actual alignment requirements, such as the helical angle may be 80° to 90°. A rotation direction of the helical structure of the second subpart 502 may be a top-down rotation direction, i.e., the rotation direction of the second subpart 502 is the same as an rotation direction of the optical axis of the first liquid crystal layer 400 relative to the optical axis of the linear polarization layer 200.

In order to achieve the helical structure of the second subpart 502, it can be achieved by adding a chiral agent to nematic liquid crystals, and there are various other ways to achieve this, which are not specifically limited by the embodiments of the present application.

A liquid crystal alignment angle of the third subpart 503 may be determined based on the preset alignment angle and the preset helix angle, for example, if the preset alignment angle is 14° and the helix angle is 80° to 90°, the liquid crystal alignment angle of the third subpart 503 may be 94° to 104°.

The second liquid crystal layer 500 may be used to convert elliptical polarized light into circular polarized light through the helical structure of the second subpart 502. After the light source 100 emits natural light, it may be converted to linear polarized light via the linear polarization layer 200. The linear polarized light may be converted to elliptical polarized light under the action of the first liquid crystal layer 400, and then the elliptical polarized light may be converted to circular polarized light through the helical structure of the second subpart 502 of the second liquid crystal layer 500. By a single alignment operation, the effect of a wide band can be achieved. The natural light emitted from the light source 100 may be converted to circular polarized light through the helical structure of the second subpart 502 of the second liquid crystal layer 500 without the need to align the second liquid crystal layer 500. The preparation process is simple, which can improve the production efficiency, i.e., the preparation efficiency as well as the yield rate of the phase retardation device can be improved.

Embodiments of the present application provide a phase retardation device, the phase retardation device comprises: a linear polarization layer, a first alignment layer, a first liquid crystal layer and a second liquid crystal layer, the linear polarization layer is located on one side of a light source and is configured to convert received light into linear polarized light, the first alignment layer is located on a side of the linear polarization layer away from the light source and is configured to align liquid crystals in the first liquid crystal layer based on a preset alignment angle, the first liquid crystal layer is located on a side of the first alignment layer away from the light source and is configured to convert the linear polarized light into elliptical polarized light, the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

Embodiments of the present application provide yet another phase retardation device. The phase retardation device contains all the functional units of the phase retardation device described above, and improves upon it by the following improvements.

Phase retardation amount of the first liquid crystal layer 400 may be a first preset value. For different light bands, a different first preset value may be selected as the phase retardation amount of the first liquid crystal layer 400. For example, for the green light 550 nm band, the phase retardation amount of the first liquid crystal layer 400 may be 190 nm (i.e., 190 nm may be selected as the first preset value).

Phase retardation amount of the second liquid crystal layer 500 may be a second preset value determined based on the first preset value and a preset compensation value. For example, the second preset value may be a product of the first preset value and the preset compensation value, any compensation value may be selected from the preset compensation range for determining the second preset value assuming that the preset compensation value is any compensation value within a preset compensation range (e.g., 85% to 100%). For example, it can be assumed that the first preset value is 190 nm and the preset compensation value is 95%, then the corresponding second preset value may be 190 nm*95%. In addition, the second preset value may be determined in a variety of ways, and the embodiments of the present application do not limit this specifically. After the second preset value is determined, the phase retardation amount of the second liquid crystal layer 500 may be determined to, compensate the first liquid crystal layer 400 for a wide band of phase retardation amount based on the phase retardation amount.

Figure 3:
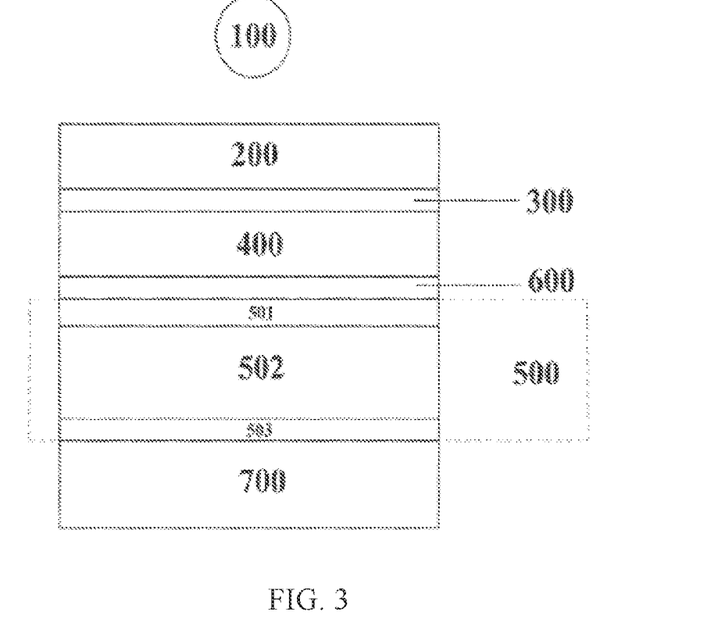
FIG. 3 is a third structural schematic diagram of a phase retardation device according to the embodiments of the disclosure.

As shown in FIG. 3, the phase retardation device may further comprise a second alignment layer 600. The second alignment layer 600 may be located between the first liquid crystal layer 400 and the second liquid crystal layer 500 and is configured to align liquid crystals in the first subpart 501 based on a preset alignment angle when the liquid crystal alignment angle of the first subpart 501 is different from the liquid crystal alignment angle of the first liquid crystal layer 400. Since in actual operation, there are factors such as the anchoring energy of the first alignment layer 300 is not strong enough, which may cause the liquid crystal alignment angle of the first subpart 501 to be different from the liquid crystal alignment angle of the first liquid crystal layer 400, a second alignment layer 600 may be arranged between the first liquid crystal layer 400 and the second liquid crystal layer 500 in order to improve the yield rate of the phase retardation device, so that the second alignment layer 600 may align the liquid crystals in the first subpart 501 of the second liquid crystal layer 500 based on the preset alignment angle, making the liquid crystal alignment angle of the first subpart 501 to be the same as the liquid crystal alignment angle of the first liquid crystal layer 400.

As shown in FIG. 3, the phase retardation device may further comprise a refractive film layer 700, which is adjacent to a third subpart 503 of the second liquid crystal layer 500 and is configured to adjust a viewing angle corresponding to circular polarized light to achieve a wide viewing angle.

The refractive film layer 700 has a refractive index satisfying $N_Z > N_X = N_Y$, wherein $N_X$ is a refractive index of the refractive film layer in a direction of lagging phase axis, and $N_Y$ is a refractive index of the refractive film layer in a direction of overrunning phase axis, and $N_Z$ is a refractive index of the refractive film layer in a thickness direction. For example, the refractive film layer 700 may be a Posi-C layer.

The first liquid crystal layer 400 and the second liquid crystal layer 500 may comprise Reactive Mesogen (RM), and light alignment molecules may be doped in the RM to simplify the process of alignment and improve production efficiency. For example, a mixture of RM and alignment molecules may be coated on a substrate (e.g., a flexible superwave substrate) and cured with polarized UV light to complete the alignment and fabrication of the first liquid crystal layer 400, and the fabrication of the second liquid crystal layer 500.

After the light source 100 emits natural light, the light may be converted to linear polarized light via the linear polarization layer 200. The linear polarized light may be converted to elliptical polarized light under the action of the first liquid crystal layer 400, and then the elliptical polarized light is converted to circular polarized light through the helical structure of the second subpart 502 of the second liquid crystal layer 500. Finally a viewing angle corresponding to the circular polarized light may be adjusted via the refractive film layer 700, to achieve the effect of wide viewing angle. If the liquid crystal alignment angle of the first subpart 501 to be different from the liquid crystal alignment angle of the first liquid crystal layer 400, a second alignment layer 600 may align the liquid crystals in the first subpart 501 based on the preset alignment angle, thereby assuring that the liquid crystal alignment angle of the first subpart 501 is the same as the liquid crystal alignment angle of the first liquid crystal layer 400, so as to improve the yield rate of the phase retardation device.

Embodiments of the present application provide a phase retardation device, the phase retardation device comprises: a linear polarization layer, a first alignment layer, a first liquid crystal layer and a second liquid crystal layer, the linear polarization layer is located on one side of a light source and is configured to convert received light into linear polarized light, the first alignment layer is located on a side of the linear polarization layer away from the light source and is configured to align liquid crystals in the first liquid crystal layer based on a preset alignment angle, the first liquid crystal layer is located on a side of the first alignment layer away from the light source and is configured to convert the linear polarized light into elliptical polarized light, the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

Figure 4:
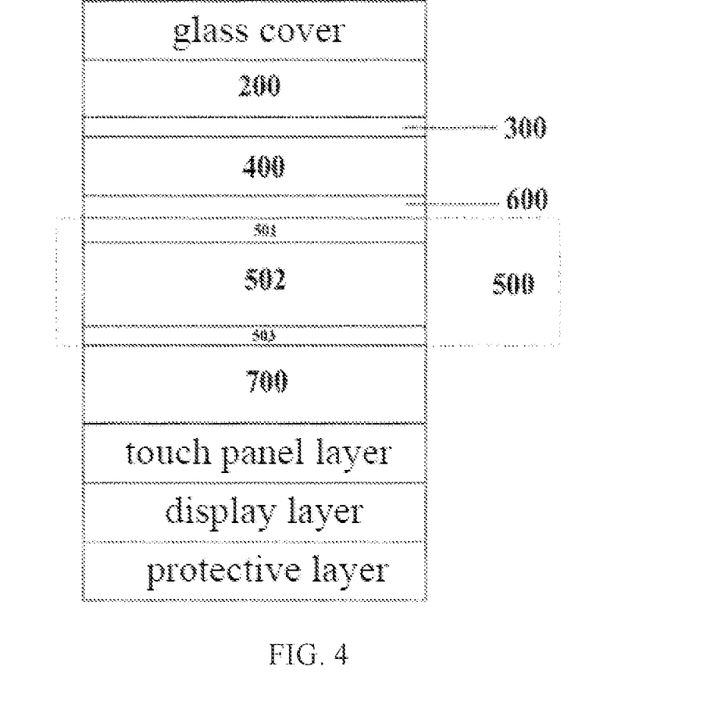
FIG. 4 is a structural schematic diagram of a display apparatus according to the embodiments of the disclosure.

Embodiments of the present application provide a display apparatus that may comprise at least one of the phase retardation devices according to the above Embodiments, where:

the linear polarization layer 200 is located on one side of a light source and is configured to convert received light into linear polarized light.

The first alignment layer 300 is located on a side of the linear polarization layer 200 away from the light source and is configured to align liquid crystals in the first liquid crystal layer 400 based on a preset alignment angle.

The first liquid crystal layer 400 is located on a side of the first alignment layer 300 away from the light source and is configured to convert the linear polarized light to elliptical polarized light.

The second liquid crystal layer 500 is located on a side of the first liquid crystal layer 400 away from the first alignment layer 300, the second liquid crystal layer 500 comprises a first subpart, a second subpart and a third subpart, the first subpart is adjacent to the first liquid crystal layer 400, a liquid crystal alignment angle of the first subpart is the same as a liquid crystal alignment angle of the first liquid crystal layer 400, the second subpart is a helical structure having a preset helical angle, a liquid crystal alignment angle of the third subpart is determined based on the preset alignment angle and the preset helical angle, and the second liquid crystal layer 500 is configured to convert the elliptical polarized light to circular polarized light via the helical structure of the second subpart.

As shown in FIG. 4, the display apparatus may comprise a glass cover, a phase retardation device, a touch panel layer, a display layer (e.g., an OLED display layer), and a protective layer (e.g., a backside protective layer) that are sequentially adjacent to each other.

The glass cover may be adjacent to the linear polarization layer 200 of the phase retardation device, and the touch panel layer may be adjacent to the refractive film layer 700 of the phase retardation device.

Embodiments of the present application provide a display apparatus comprising a phase retardation device, the phase retardation device comprises: a linear polarization layer, a first alignment layer, a first liquid crystal layer and a second liquid crystal layer, the linear polarization layer is located on one side of a light source and is configured to convert received light into linear polarized light, the first alignment layer is located on a side of the linear polarization layer away from the light source and is configured to align liquid crystals in the first liquid crystal layer based on a preset alignment angle, the first liquid crystal layer is located on a side of the first alignment layer away from the light source and is configured to convert the linear polarized light into elliptical polarized light, the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

Figure 5:
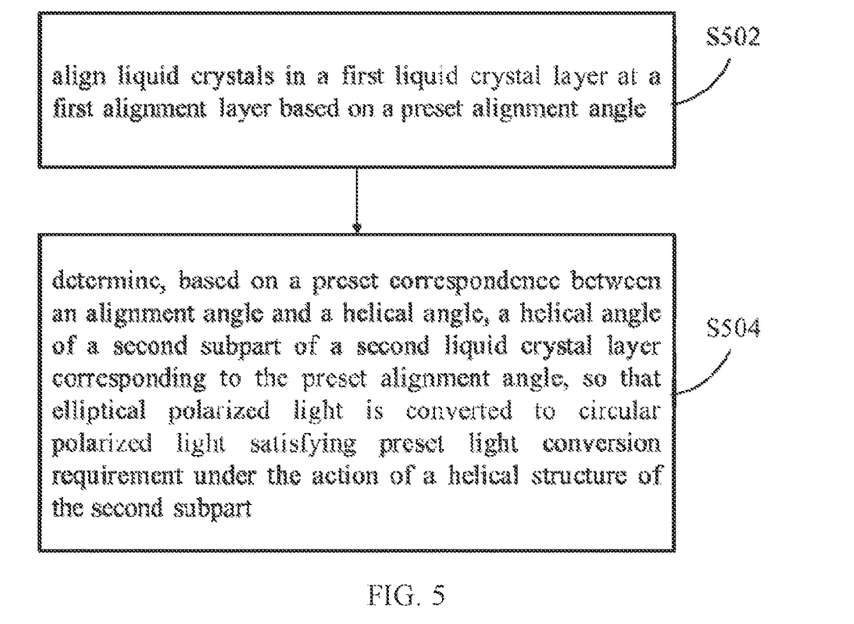
FIG. 5 is a first schematic flow diagram of a phase retardation device according to the embodiments of the disclosure.

The above is a phase retardation device provided by embodiments of the present application. Based on the functions and composition structure of the phase retardation device, embodiments of the present application further provide a preparation method for a phase retardation device, an execution subject of the method can be an electronic device, and the electronic device can be used to prepare the phase retardation device according to the above Embodiments. As shown in FIG. 5, the method can specifically comprise the following steps.

S502: Aligning liquid crystals in a first liquid crystal layer at a first alignment layer based on a preset alignment angle.

S504: Determining, based on a preset correspondence between an alignment angle and a helical angle, a helical angle of a second subpart of a second liquid crystal layer corresponding to the preset alignment angle, so that elliptical polarized light is converted to circular polarized light satisfying preset light conversion requirement under the action of a helical structure of the second subpart.

The light conversion requirement can be used to determine whether an alignment angle of a third subpart of the second liquid crystal layer satisfies a preset angle range.

In the implementation, the preset correspondence between the alignment angle and the helical angle can be determined based on historical alignment angle, historical helical angle and the light conversion requirement, and then the helical angle of the second subpart of the second liquid crystal layer corresponding to the preset alignment angle can be determined based on the preset correspondence between the alignment angle and the helical angle.

The method for determining the preset correspondence between the alignment angle and the helical angle can be various and can vary according to the actual application scenario, and the embodiments of the present application do not specifically limit this.

Embodiments of the present application provide a preparation method for a phase retardation device, the phase retardation device comprises: a linear polarization layer, a first alignment layer, a first liquid crystal layer and a second liquid crystal layer, the linear polarization layer is located on one side of a light source and is configured to convert received light into linear polarized light, the first alignment layer is located on a side of the linear polarization layer away from the light source and is configured to align liquid crystals in the first liquid crystal layer based on a preset alignment angle, the first liquid crystal layer is located on a side of the first alignment layer away from the light source and is configured to convert the linear polarized light into elliptical polarized light, the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

Figure 6:
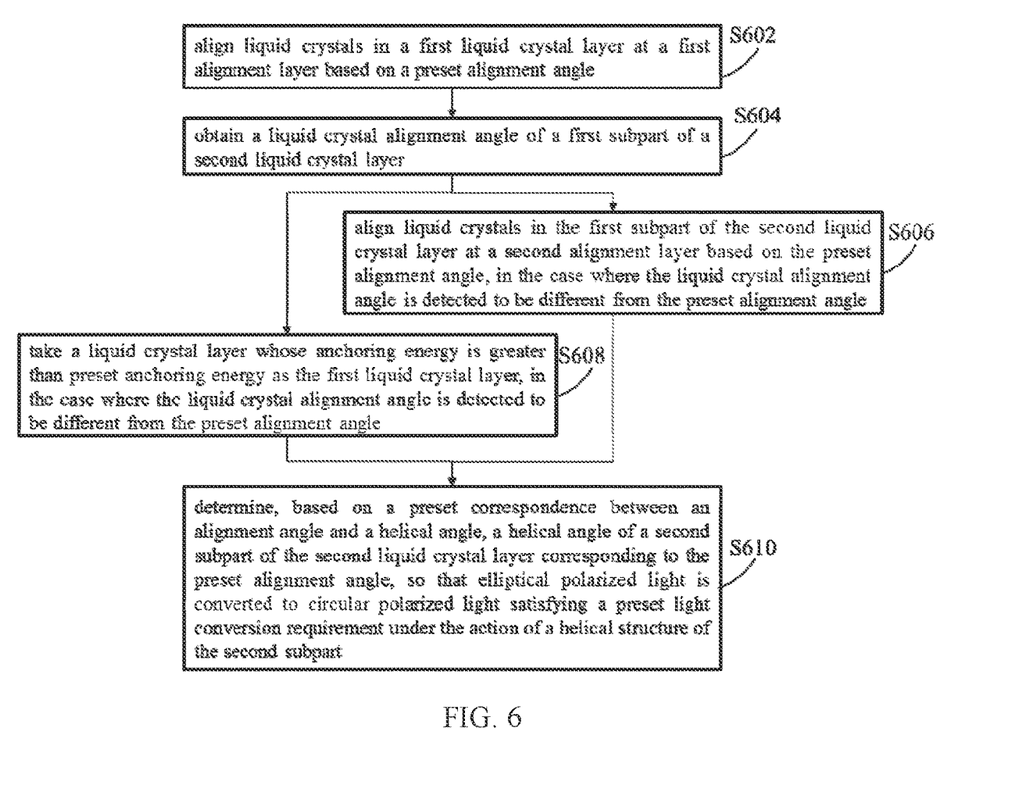
FIG. 6 is a second schematic flow diagram of a phase retardation device according to the embodiments of the disclosure.

Based on the functions and composition structure of the phase retardation device provided in the above Embodiments, embodiments of the present application further provide a preparation method for a phase retardation device, an execution subject of the method may be an electronic device, and the electronic device can be used to prepare the phase retardation device according to the above Embodiments. As shown in FIG. 6, the method can specifically comprise the following steps.

S602: Aligning liquid crystals in a first liquid crystal layer at a first alignment layer based on a preset alignment angle.

S604: Obtaining a liquid crystal alignment angle of a first subpart of a second liquid crystal layer.

Since in actual operation, there can be factors such as insufficient anchoring energy or operation deviation that cause the liquid crystal alignment angle of the first subpart of the second liquid crystal layer to be different from the alignment angle of the first liquid crystal layer, the liquid crystal alignment angle of the first subpart of the second liquid crystal layer can be detected, to make the liquid crystal alignment angle of the first subpart the same as the preset alignment angle, i.e., after S604, it may be continued to execute S606 or S608.

S606: Aligning liquid crystals in the first subpart of the second liquid crystal layer at a second alignment layer based on the preset alignment angle, in the case where the liquid crystal alignment angle is detected to be different from the preset alignment angle.

In the implementation, in the case where the phase retardation device further comprise a second alignment layer, liquid crystals in the first subpart of the second liquid crystal layer can be aligned at the second alignment layer based on the preset alignment angle, to make the liquid crystal alignment angle of the first subpart the same as the preset alignment angle.

S608: Taking a liquid crystal layer whose anchoring energy is greater than preset anchoring energy as the first liquid crystal layer, in the case where the liquid crystal alignment angle is detected to be different from the preset alignment angle.

The anchoring energy can be a force used to restrict the alignment direction of the liquid crystal molecules.

In the implementation, in the case where the liquid crystal alignment angle is detected to be different from the preset alignment angle, first anchoring energy corresponding to the first liquid crystal layer at this moment can be obtained, and the first anchoring energy can be used as the preset anchoring energy, and then the liquid crystal layer with the anchoring energy greater than this preset anchoring energy can be determined as the first liquid crystal layer to ensure that the liquid crystal alignment angle of the first liquid crystal layer is the same as the liquid crystal alignment angle of the first subpart.

In addition, the above method of determining the preset anchoring energy is an optional and achievable determination method, and in the actual application scenario, there can be a variety of determination methods, which can vary according to the actual application scenario, and the embodiments of the present application do not specifically limit this.

S610: Determining, based on a preset correspondence between an alignment angle and a helical angle, a helical angle of a second subpart of the second liquid crystal layer corresponding to the preset alignment angle, so that elliptical polarized light is converted to circular polarized light satisfying a preset light conversion requirement under the action of a helical structure of the second subpart.

Embodiments of the present application provide a preparation method for a phase retardation device, the phase retardation device comprises: a linear polarization layer, a first alignment layer, a first liquid crystal layer and a second liquid crystal layer, the linear polarization layer is located on one side of a light source and is configured to convert received light into linear polarized light, the first alignment layer is located on a side of the linear polarization layer away from the light source and is configured to align liquid crystals in the first liquid crystal layer based on a preset alignment angle, the first liquid crystal layer is located on a side of the first alignment layer away from the light source and is configured to convert the linear polarized light into elliptical polarized light, the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

Figure 7:
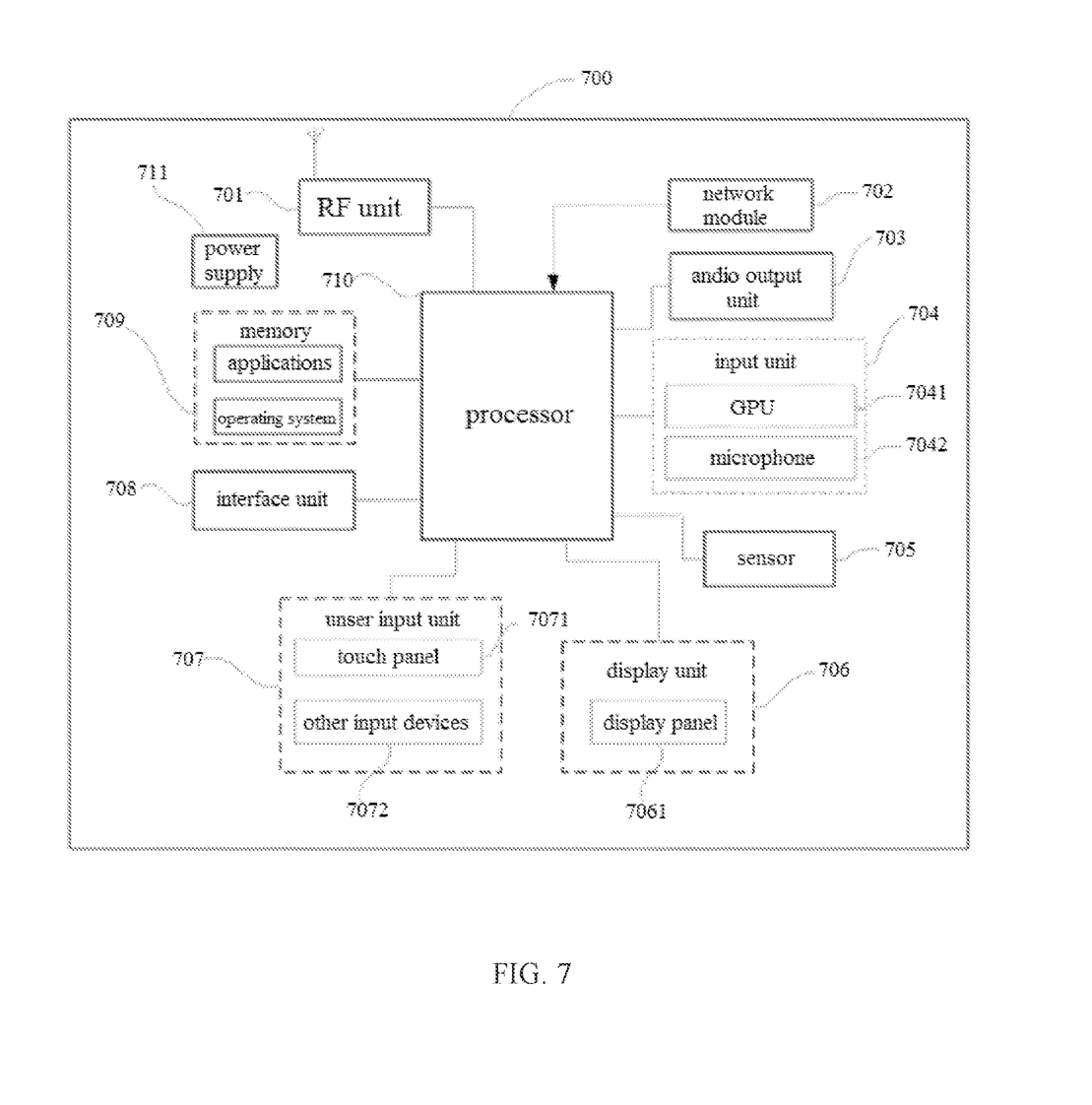
FIG. 7 is a structural schematic diagram of an electronic device of the present application.

FIG. 7 is a schematic diagram of hardware structure of an electronic device that implements the above embodiments of the present application.

The electronic device 700 comprises, but is not limited to, an RF unit 701, a network module 702, an audio output unit 703, an input unit 704, a sensor 705, a display unit 706, a user input unit 707, an interface unit 708, a memory 709, a processor 710, and a power supply 711, etc. It will be understood by those skilled in the art that the structure of the electronic device illustrated in FIG. 7 does not constitute a limitation of the electronic device, and that the electronic device can comprise more or fewer components than illustrated, or a combination of certain components, or a different arrangement of components. In embodiments of the present application, the electronic device includes, but is not limited to, a cell phone, a tablet computer, a laptop computer, a handheld computer, a vehicle terminal, a wearable device, and a pedometer.

The processor 710 is configured to: align liquid crystals in a first liquid crystal layer at a first alignment layer based on a preset alignment angle; and determine, based on a preset correspondence between an alignment angle and a helical angle, a helical angle of a second subpart of a second liquid crystal layer corresponding to the preset alignment angle, so that an elliptical polarized light is converted to a circular polarized light satisfying a preset light conversion requirement under the action of a helical structure of the second subpart.

Further, the processor 710 is configured to: obtain a liquid crystal alignment angle of a first subpart of the second liquid crystal layer; and align liquid crystals in the first subpart of the second liquid crystal layer at a second alignment layer based on the preset alignment angle, in the case where the liquid crystal alignment angle is detected to be different from the preset alignment angle.

Further, the processor 710 is configured to: obtain a liquid crystal alignment angle of a first subpart of the second liquid crystal layer; and take a liquid crystal layer whose anchoring energy is greater than preset anchoring energy as the first liquid crystal layer, in the case where the liquid crystal alignment angle is detected to be different from the preset alignment angle.

Embodiments of the present application provide an electronic device for preparing a phase retardation device, the phase retardation device comprises: a linear polarization layer, a first alignment layer, a first liquid crystal layer and a second liquid crystal layer, the linear polarization layer is located on one side of a light source and is configured to convert received light into linear polarized light, the first alignment layer is located on a side of the linear polarization layer away from the light source and is configured to align liquid crystals in the first liquid crystal layer based on a preset alignment angle, the first liquid crystal layer is located on a side of the first alignment layer away from the light source and is configured to convert the linear polarized light into elliptical polarized light, the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

It should be understood that, in the embodiments of the present application, the RF unit 701 can be configured for reception and transmission of signals during sending and receiving messages or calls. Specifically, downlink data from a base station is received and then provided to the processor 710 for processing. In addition, uplink data is sent to the base station. Typically, the RF unit 701 comprises, but is not limited to, an antenna, at least one amplifier, a transceiver, a coupler, a low-noise amplifier, a duplexer, etc. In addition, the RF unit 701 can also communicate with networks and other apparatuses through wireless communication systems.

The electronic device provides an user with wireless broadband Internet access through the network module 702, such as helping the user to send and receive e-mail, browse the Web and access streaming media.

The audio output unit 703 can convert audio data received by the RF unit 701 or the network module 702 or stored in the memory 709 into audio signals and output them as sound. Moreover, the audio output unit 703 can also provide audio output associated with a specific function performed by the electronic device 700 (e.g., call signal reception sound, message reception sound, etc.). The audio output unit 703 comprises a speaker, a buzzer, and a telephone receiver, etc.

The input unit 704 is configured to receive audio or video signals. The input unit 704 can comprise a Graphics Processing Unit (GPU) 7041 and a microphone 7042, and the Graphics Processing Unit 7041 processes image data of still pictures or videos obtained by an image capture device (e.g., a camera) in video capture mode or image capture mode. Processed image frames can be displayed on the display unit 706. The image frames processed by the Graphics Processing Unit 7041 can be stored in the memory 709 (or other storage media) or sent via the RF unit 701 or the network module 702. The microphone 7042 can receive sound and process such sound into audio data. Processed audio data can be converted, under a telephone talking mode, to a format of output that can be sent to a mobile base station via the RF unit 701.

The electronic device 700 further comprises at least one sensor 705, such as a light sensor, a motion sensor, and other sensors. Specifically, the light sensor comprises an ambient light sensor and a proximity sensor, wherein the ambient light sensor can adjust brightness of a display panel 7061 based on brightness of ambient light, and the proximity sensor can turn off the display panel 7061 and/or backlight when the electronic device 700 is moved to the ear. As a type of motion sensor, an accelerometer sensor can detect the magnitude of acceleration in all directions (typically three axes), and the magnitude and direction of gravity when stationary, and can be used to identify a posture of the electronic device (e.g., horizontal and vertical screen switching, related games, magnetometer posture calibration), vibration recognition related functions (e.g., pedometer, tapping), etc.; the sensor 705 can also comprise a fingerprint sensor, pressure sensor, iris sensor, molecular sensor, gyroscope, barometer, hygrometer, thermometer, infrared sensor, etc., and will not be repeated here.

The display unit 706 is configured to display information entered by or provided to the user. The display unit 706 can comprise the display panel 7061, the display panel 7061 can be configured in the form of a Liquid Crystal Display (LCD), an Organic Light-Emitting Diode (OLED), etc.

The user input unit 707 can be configured to receive input numeric or character information, as well as to generate key signal input related to user settings and functional control of the electronic device. Specifically, the user input unit 707 comprises a touch panel 7071 as well as other input devices 7072. The touch panel 7071, also referred to as a touch screen, can collect the user's touch operations on or near it (e.g., the user's operations on or near the touch panel 7071 using any suitable object or attachment such as a finger, stylus, etc.). The touch panel 7071 can comprise two parts: a touch detection device and a touch controller. The touch detection device detects the user's touch orientation and detects the signal brought by the touch operation and sends the signal to the touch controller; the touch controller receives the touch information from the touch detection device and converts it into contact coordinates and sends it to the processor 710, and receives the command from the processor 710 and executes it. In addition, the touch panel 7071 can be implemented in various types, such as resistive, capacitive, infrared, and surface acoustic wave. In addition to the touch panel 7071, the user input unit 707 can also comprise other input devices 7072. Specifically, other input devices 7072 can comprise, but are not limited to, physical keyboards, function keys (such as volume control buttons, switch buttons, etc.), trackballs, mice, and joystick, and are not described herein.

Further, the touch panel 7071 can be overlaid on the display panel 7061, and when the touch panel 7071 detects a touch operation on or near it, it is transmitted to the processor 710 to determine the type of touch event, and subsequently the processor 710 provides a corresponding visual output on the display panel 7061 based on the type of touch event. Although in FIG. 7, the touch panel 7071 and the display panel 7061 are used as two separate components to implement the input and output functions of the electronic device, in some embodiments, the touch panel 7071 can be integrated with the display panel 7061 to implement the input and output functions of the electronic device, specifically without limitation here.

The interface unit 708 is an interface for an external device to connect to the electronic device 700. For example, the external device can comprise a wired or wireless headset port, an external power (or battery charger) port, a wired or wireless data port, a memory card port, a port for connecting to a device having an identification module, an audio input/output (I/O) port, a video I/O port, a headset port, and so forth. The interface unit 708 can be configured to receive input from an external device (e.g., data information, power, etc.) and transmit the received input to one or more components within the electronic device 700 or can be configured to transmit data between the electronic device 700 and the external device.

The memory 709 can be configured to store software programs as well as various data. The memory 709 can primarily comprise a program memory area and a data memory area, wherein the program memory area can store an operating system, applications required for at least one function (e.g., a sound playback function, an image playback function, etc.), etc., and the data memory area can store data created based on use of the phone (e.g., audio data, phone book, etc.), etc. In addition, the memory 709 can comprise high-speed random-access memory, and can also comprise non-volatile memory, such as at least one disk memory device, flash memory device, or other volatile solid-state memory device.

The processor 710 is the control center of the electronic device and connects various parts of the entire electronic device using various interfaces and lines. The processor 710 performs various functions of the electronic device and processes data by running or executing software programs and/or modules stored in the memory 709 and calling data stored in the memory 709, to provide overall monitoring of the electronic device. The processor 710 can comprise one or more processing units. Preferably, the processor 710 can integrate an application processor and a modem processor, wherein the application processor primarily handles the operating system, user interface, and applications, etc., and the modem processor primarily handles wireless communications. It will be appreciated that the above modem processor can also not be integrated into the processor 710.

The electronic device 700 can also comprise a power supply 711 (e.g., a battery) to power the various components, and preferably, the power supply 711 can be logically connected to the processor 710 through a power management system so that functions such as managing charging, discharging, and power consumption management are implemented through the power management system.

Preferably, embodiments of the present application further provide an electronic device comprising a processor 710 and a memory 709. A computer program is stored on the memory 709 and executable by the processor 710. The computer program when executed by the processor 710 implements various processes of the above-mentioned preparation method embodiments and can achieve the same technical effect, and to avoid repetition, it will not be repeated here.

Embodiments of the present application provide a computer-readable storage medium storing a computer program. The computer program when executed by a processor, implements various processes of the above-mentioned preparation method embodiments and can achieve the same technical effect. To avoid repetition, it will not be repeated here. The computer-readable storage medium can be, for example, Read-Only Memory (ROM), Random Access Memory (RAM), disk or CD-ROM, etc.

Embodiments of the present application provide a computer-readable storage medium for preparing a phase retardation device, the phase retardation device comprises: a linear polarization layer, a first alignment layer, a first liquid crystal layer and a second liquid crystal layer, the linear polarization layer is located on one side of a light source and is configured to convert received light into linear polarized light, the first alignment layer is located on a side of the linear polarization layer away from the light source and is configured to align liquid crystals in the first liquid crystal layer based on a preset alignment angle, the first liquid crystal layer is located on a side of the first alignment layer away from the light source and is configured to convert the linear polarized light into elliptical polarized light, the second liquid crystal layer is located on a side of the first liquid crystal layer away from the first alignment layer, the second liquid crystal layer comprises a first subpart, a second subpart and a third subpart, the first subpart is adjacent to the first liquid crystal layer, a liquid crystal alignment angle of the first subpart is the same as a liquid crystal alignment angle of the first liquid crystal layer, the second subpart is a helical structure having a preset helical angle, a liquid crystal alignment angle of the third subpart is determined based on the preset alignment angle and the preset helical angle, and the second liquid crystal layer is configured to convert the elliptical polarized light to circular polarized light by the helical structure of the second subpart. In this way, since the second liquid crystal layer in the phase retardation device comprises a second subpart having a helical structure, the natural light emitted from the light source can be converted into circular polarized light by the second subpart of the second liquid crystal layer after only one alignment for the first liquid crystal layer through the first alignment layer when preparing the phase retardation device, and since the number of alignment operations is low, the problem of low preparation efficiency caused by multiple alignment operations can be avoided, and the yield rate of the device can also be improved.

It should be understood by those skilled in the art that embodiments of the present application can be provided as methods, systems, or computer program products. Accordingly, the present application can take the form of an entirely hardware embodiment, an entirely software embodiment, or an embodiment combining software and hardware aspects. Further, the present application can take the form of a computer program product implemented on one or more computer usable storage media (including, but not limited to, disk memory, CD-ROM, optical memory, etc.) containing computer usable program code therein.

The present application is described with reference to flowcharts and/or block diagrams of methods, apparatuses (systems), and computer program products according to embodiments of the present application. It should be understood that each process and/or block in the flowcharts and/or block diagrams, and the combination of processes and/or blocks in the flowcharts and/or block diagrams, can be implemented by computer program instructions. These computer program instructions can be provided to a processor of a general purpose computer, a specialized computer, an embedded processor, or other programmable data processing device to produce a machine such that the instructions executed by the processor of the computer or other programmable data processing device produce a device for implementing the functions specified in one process or multiple processes in the flowcharts and/or one block or multiple blocks in the block diagrams.

These computer program instructions can also be stored in a computer readable memory capable of directing a computer or other programmable data processing device to operate in a particular manner, such that the instructions stored in such computer readable memory produce an article of manufacture comprising an instruction device that implements the function specified in one or more processes of the flowcharts and/or one or more blocks of the block diagrams.

These computer program instructions can also be loaded onto a computer or other programmable data processing device such that a series of operational steps are executed on the computer or other programmable device to produce computer-implemented processing such that the instructions executed on the computer or other programmable device provide the steps used to perform the functions specified in one or more processes of the flowcharts and/or one or more blocks of the block diagrams.

In a typical configuration, a computing device comprises one or more processors (CPUs), input/output interfaces, network interfaces, and memory.

The memory can comprise non-permanent memory, random access memory (RAM) and/or non-volatile memory in the computer readable media, such as read-only memory (ROM) or flash memory. The memory is an example of a computer readable medium.

The computer readable media comprises permanent and non-permanent, removable and non-removable media. Any method or technology can be used to implement information storage. The information can be computer readable instructions, data structures, modules of a program, or other data. Examples of storage media for computers comprise, but are not limited to, Phase Change Random Access Memory (PRAM), Static Random Access Memory (SRAM), Dynamic Random Access Memory (DRAM), other types of Random Access Memory (RAM), Read-Only Memory (ROM), Electrically Erasable Programmable Read-Only Memory (EEPROM), flash memory or other memory technologies, Compact Disc Read-Only Memory (CD-ROM), Digital Versatile Disc (DVD) or other optical storage, magnetic cartridge tape, magnetic tape disk storage or other magnetic storage device or any other non-transport medium, and can be used to store information that can be accessed by the computing device. As defined herein, the computer readable media does not comprise transient computer readable media (transitory media), such as modulated data signals and carrier waves.

It is also important to note that the terms "include" "comprise" or any other variation thereof are intended to cover non-exclusive inclusion, such that a process, method, article, or apparatus that includes a set of elements includes not only those elements, but also other elements not expressly listed, or elements that are inherent to such process, method, article, or apparatus. Without further limitation, the inclusion of an element as defined by the statement "comprise one . . . " does not preclude the existence of additional identical elements in the process, method, article, or apparatus including the element.

It should be understood by those skilled in the art that embodiments of the present application can be provided as methods, systems, or computer program products. Accordingly, the present application can take the form of an entirely hardware embodiment, an entirely software embodiment, or an embodiment combining software and hardware aspects. Further, the present application can take the form of a computer program product implemented on one or more computer usable storage media (including, but not limited to, disk memory, CD-ROM, optical memory, etc.) containing computer usable program code therein.

The above description is only embodiments of the present application and is not intended to limit the present application. To a person skilled in the art, the present application can be subject to various modifications and variations. Any modification, equivalent replacement, improvement, etc. made within the spirit and principle of the present application shall be included in the scope of the claims of the present application.

What is claimed is:

1. A phase retardation device, comprising: a linear polarization layer, a first alignment layer, a first liquid crystal layer, and a second liquid crystal layer;
   the linear polarization layer being located on a side of a light source and configured to convert a received light into a linear polarized light;
   the first alignment layer being located on a side of the linear polarization layer away from the light source and configured to align liquid crystals in the first liquid crystal layer based on a preset alignment angle;
   the first liquid crystal layer being located on a side of the first alignment layer away from the light source and configured to convert the linear polarized light to an elliptical polarized light;
   the second liquid crystal layer being located on a side of the first liquid crystal layer away from the first alignment layer, the second liquid crystal layer comprising a first subpart, a second subpart and a third subpart, the first subpart being adjacent to the first liquid crystal layer, a liquid crystal alignment angle of the first subpart being the same as a liquid crystal alignment angle of the first liquid crystal layer, the second subpart being a helical structure having a preset helical angle, a liquid crystal alignment angle of the third subpart being determined based on the preset alignment angle and the preset helical angle, and the second liquid crystal layer being configured to convert the elliptical polarized light to a circular polarized light via the helical structure of the second subpart.

2. The phase retardation device according to claim 1, wherein a phase retardation amount of the first liquid crystal layer is a first preset value, and a phase retardation amount of the second liquid crystal layer is a second preset value determined based on the first preset value and a preset compensation value.

3. The phase retardation device according to claim 1, wherein the phase retardation device further comprises a second alignment layer, the second alignment layer is located between the first liquid crystal layer and the second liquid crystal layer and is configured to align liquid crystals in the first subpart based on the preset alignment angle so as to make the liquid crystal alignment angle of the first subpart to be the same as the liquid crystal alignment angle of the first liquid crystal layer.

4. The phase retardation device according to claim 1, wherein the phase retardation device further comprises a refractive film layer, the refractive film layer is adjacent to the third subpart of the second liquid crystal layer and is configured to adjust a viewing angle corresponding to the circular polarized light.

5. The phase retardation device according to claim 4, wherein the refractive film layer has a refractive index satisfying $N_Z > N_X = N_Y$, wherein $N_X$ is a refractive index of the refractive film layer in a direction of lagging phase axis, $N_Y$ is a refractive index of the refractive film layer in a direction of overrunning phase axis, and $N_Z$ is a refractive index of the refractive film layer in a thickness direction.

6. The phase retardation device according to claim 1 wherein the first liquid crystal layer and the second liquid crystal layer each comprises Reactive Mesogen.

7. A display apparatus, wherein the display apparatus comprises the phase retardation device according to claim 1.

8. A preparation method of a phase retardation device, wherein the method is applied to the phase retardation device according to claim 1, and the method comprises:

aligning the liquid crystals in the first liquid crystal layer at the first alignment layer based on the preset alignment angle; and determining, based on a preset correspondence between an alignment angle and a helical angle, the preset helical angle of the second subpart of the second liquid crystal layer corresponding to the preset alignment angle, so that the elliptical polarized light is converted to the circular polarized light satisfying a preset light conversion requirement under an action of the helical structure of the second subpart.

9. The method according to claim 8, wherein the phase retardation device further comprises a second alignment layer, before the determining, based on a preset correspondence between an alignment angle and a helical angle, the preset helical angle of the second subpart of the second liquid crystal layer corresponding to the preset alignment angle, the method further comprises:

obtaining the liquid crystal alignment angle of the first subpart of the second liquid crystal layer; and aligning the liquid crystals in the first subpart of the second liquid crystal layer at the second alignment layer based on the preset alignment angle, so as to make the liquid crystal alignment angle of the first subpart to be the same as the preset alignment angle.

10. The method according to claim 8, wherein before the determining, based on a preset correspondence between an alignment angle and a helical angle, the preset helical angle of the second subpart of the second liquid crystal layer corresponding to the preset alignment angle, the method further comprises:

obtaining the liquid crystal alignment angle of the first subpart of the second liquid crystal layer; and taking a liquid crystal layer whose anchoring energy is greater than preset anchoring energy as the first liquid crystal layer, so as to make the liquid crystal alignment angle of the first subpart to be the same as the preset alignment angle.

* * * * *